United States Patent
Yan

(10) Patent No.: US 9,634,214 B2
(45) Date of Patent: Apr. 25, 2017

(54) GRAPHITE-CONTAINING SUBSTRATES FOR LED PACKAGES

(71) Applicant: LedEngin, Inc., San Jose, CA (US)

(72) Inventor: Xiantao Yan, Palo Alto, CA (US)

(73) Assignee: LedEngin, Inc., San Jose, CA (US)

( * ) Notice: Subject to any disclaimer, the term of this patent is extended or adjusted under 35 U.S.C. 154(b) by 0 days.

(21) Appl. No.: 14/072,387

(22) Filed: Nov. 5, 2013

(65) Prior Publication Data

US 2014/0124822 A1  May 8, 2014

Related U.S. Application Data

(60) Provisional application No. 61/722,754, filed on Nov. 5, 2012.

(51) Int. Cl.
*H05K 1/14* (2006.01)
*H05K 1/00* (2006.01)
(Continued)

(52) U.S. Cl.
CPC ........ *H01L 33/641* (2013.01); *H01L 21/4807* (2013.01); *H01L 23/15* (2013.01); *H01L 23/3731* (2013.01); *H01L 23/49506* (2013.01); *H01L 29/1606* (2013.01); *H01L 33/48* (2013.01); *H01L 33/64* (2013.01); *H01L 2224/05187* (2013.01);
(Continued)

(58) Field of Classification Search
CPC ........ H01L 2924/00; H01L 2924/0002; H01L 2924/15793; H01L 2924/15787; H01L 2924/05032; H01L 33/64; H01L 33/641; H01L 33/48; H01L 29/1606; H01L 2224/05193; H01L 2224/13193; H01L 2224/29193; H01L 2224/37193; H01L 2224/45193; H01L 2224/80493; H01L 2224/81493; H01L 2224/05187; H01L 2224/13187; H01L 2224/29187; H01L 2224/37187; H01L 2224/45187; H01L 2224/80487; H01L 2224/81587; H01L 23/15; H01L 23/3731; H01L 23/49503; H01L 23/49506; H01L 21/4807
USPC ................. 257/99, 433, 700, 702, 703, 705, 257/E39.009, E23.009, E23.106, E23.113, 257/668, 774; 361/715–804
See application file for complete search history.

(56) References Cited

U.S. PATENT DOCUMENTS 3,489,845 A * 1/1970 Landron .................... 174/556
4,609,586 A * 9/1986 Jensen .................. H05K 1/056
428/209

(Continued)

FOREIGN PATENT DOCUMENTS

JP          4700469 B2 *  6/2011

*Primary Examiner* — Teresa M Arroyo
(74) *Attorney, Agent, or Firm* — Kilpatrick Townsend & Stockton, LLP

(57) ABSTRACT

Substrates and packages for LED based light devices can incorporate a material with high thermal conductivity in at least the lateral direction (e.g., graphite or graphene) to spread heat across the surface of the substrate. A substrate or layer in a multi-layer substrate can have a graphite core disposed between ceramic sublayers that provide electrical insulation and thermal conductivity in the transverse direction. Another substrate or layer in a multi-layer substrate can be fabricated using a composite of graphite and ceramic materials.

24 Claims, 7 Drawing Sheets

(51) Int. Cl.
*H01L 33/00* (2010.01)
*H01L 31/0203* (2014.01)
*H01L 23/12* (2006.01)
*H01L 23/053* (2006.01)
*H01L 23/14* (2006.01)
*H01L 23/06* (2006.01)
*H01L 23/15* (2006.01)
*H01L 23/48* (2006.01)
*H01L 23/52* (2006.01)
*H01L 29/40* (2006.01)
*H01L 33/64* (2010.01)
*H01L 23/495* (2006.01)
*H01L 23/373* (2006.01)
*H01L 21/48* (2006.01)
*H01L 33/48* (2010.01)
*H01L 29/16* (2006.01)

(52) U.S. Cl.
CPC ............... *H01L 2224/05193* (2013.01); *H01L 2224/29187* (2013.01); *H01L 2224/29193* (2013.01); *H01L 2924/0002* (2013.01); *H01L 2924/05032* (2013.01); *H01L 2924/15787* (2013.01); *H01L 2924/15793* (2013.01)

(56) References Cited

U.S. PATENT DOCUMENTS

| | | | |
|---|---|---|---|
| 5,195,021 A * | 3/1993 | Ozmat | H01L 23/3735 174/252 |
| 8,222,662 B2 * | 7/2012 | Shen et al. | 257/98 |
| 2005/0127334 A1 * | 6/2005 | Shibata | H01J 1/304 252/502 |
| 2006/0243997 A1 * | 11/2006 | Yang et al. | 257/98 |
| 2007/0269964 A1 * | 11/2007 | Sung | 438/479 |
| 2008/0096309 A1 * | 4/2008 | Sung | 438/105 |
| 2008/0289810 A1 * | 11/2008 | Okabayashi | 165/185 |
| 2010/0132871 A1 * | 6/2010 | Hattori et al. | 156/60 |
| 2010/0159223 A1 * | 6/2010 | Keese | D06N 3/0077 428/219 |
| 2010/0259930 A1 | 10/2010 | Yan | |
| 2011/0042649 A1 * | 2/2011 | Duvall | B82Y 10/00 257/27 |
| 2011/0068350 A1 * | 3/2011 | Sung | 257/77 |
| 2011/0204408 A1 * | 8/2011 | McKenzie et al. | 257/99 |
| 2012/0080086 A1 * | 4/2012 | Yoon et al. | 136/256 |
| 2012/0258587 A1 * | 10/2012 | Kub | C01B 31/0446 438/610 |
| 2013/0266501 A1 * | 10/2013 | He | C01B 31/043 423/415.1 |
| 2013/0280535 A1 * | 10/2013 | Maas | A62C 2/065 428/412 |
| 2013/0285106 A1 * | 10/2013 | Wei et al. | 257/99 |
| 2014/0162020 A1 * | 6/2014 | Wang | B32B 5/24 428/113 |
| 2014/0293513 A1 * | 10/2014 | Eilertsen | H01G 9/042 361/528 |
| 2014/0318591 A1 * | 10/2014 | Shelby | B29C 61/02 136/225 |
| 2015/0014853 A1 * | 1/2015 | Brenner | H01L 21/76838 257/746 |
| 2015/0252160 A1 * | 9/2015 | Teranishi | C08J 5/24 428/413 |
| 2015/0253089 A1 * | 9/2015 | Fan | B32B 15/04 165/185 |

* cited by examiner

GRAPHITE-CONTAINING SUBSTRATES FOR LED PACKAGES

CROSS REFERENCE TO RELATED APPLICATIONS

This application claims the benefit of U.S. Provisional Application No. 61/722,754, filed Nov. 5, 2012, entitled "Graphite-Containing Substrates for LED Packages," the disclosure of which is incorporated by reference herein in its entirety.

BACKGROUND

Embodiments of the present invention relate to solid-state light devices, and more specifically to packages for solid-state light devices.

A light-emitting diode (LED) is a semiconductor device that produces light when an electric current is passed therethrough. LEDs have many advantages over conventional lighting sources, including compact size, low weight, longer life time, high vibration resistance, and higher reliability. In addition to having widespread applications for electronic products as indicator lights, LEDs also have become an important alternative light source for various applications where incandescent and fluorescent lamps have traditionally dominated, such as residential, commercial, and industrial lighting.

In a typical LED-based white light producing device, a monochromatic LED is encapsulated by a transparent material containing appropriate compensatory phosphors. The wavelength(s) of the light emitted from the compensatory phosphor is compensatory to the wavelength of the light emitted by the LED such that the wavelengths from the LED and the compensatory phosphor mix together to produce white light. For instance, a blue LED-based white light source produces white light by using a blue light LED and a phosphor that emits a yellowish light when excited by the blue light emitted from the LED. In these devices the amount of the phosphor in the transparent material is controlled such that only a fraction of the blue light is absorbed by the phosphor while the remainder passes unabsorbed. The yellowish light and the unabsorbed blue light mix to produce white light.

Another exemplary scheme uses an LED that produces light outside of the visible spectrum, such as ultraviolet (UV) light, together with a mixture of phosphors capable of producing either red, green, or blue light when excited. In this scheme, the light emitted by the LED only serves to excite the phosphors and does not contribute to the final color balance.

To provide an operational lamp, one or more LED dice are typically mounted on a substrate that provides electrical contacts and mechanical couplings and covered with one or more layers of optically transparent and/or wavelength-shifting materials, in some cases including a primary lens to direct the exiting light. This combination of LEDs, substrate, and optical materials is sometimes referred to as a "package." The lamp itself may also include a secondary lens, heat sink, mechanical and/or electrical connections allowing the lamp to be installed in a light fixture, and so on.

SUMMARY

Design and manufacture of LEDs continue to improve, and LEDs now exist that can operate at currents of, e.g., up to 2 A. Operating at higher current produces not only a brighter light but also larger amounts of heat that must be transferred away from the LEDs in order to keep their temperature from exceeding operational limits. The thermal transfer capabilities of existing packages may not be sufficient to take full advantage of improvements in LEDs.

Embodiments of the present invention provide substrates and packages for LED-based light devices that can significantly improve thermal performance, allowing the LEDs to operate at higher current and therefore higher brightness. The substrates can incorporate a material with high thermal conductivity in at least the lateral direction (i.e., parallel to a surface on which LEDs are mounted), such as graphite or graphene, to spread heat across the surface of the substrate. In addition to allowing for more efficient heat dissipation, heat spreading reduces the local temperature at "hot spots" within the device, such as the locations of operating LEDs and/or electrically conductive paths. Reducing hot spots can reduce thermal stress and allow a device to operate at higher temperatures without damaging the package.

Certain aspects of the present invention relate to substrates for lighting apparatus. In one embodiment, the substrate includes a body having one or more layers. Each layer can have a core made of a material such as graphite or graphene that provides high thermal conductivity laterally within the layer. The top and bottom surfaces of the core can each be covered in a sublayer made of an electrically insulating ceramic material such as alumina ($Al_2O_3$) or aluminum nitride (AlN). Metal patterns (e.g., traces and/or pads that serve to provide electrical connectivity between different areas, such as between LEDs mounted on the top of the substrate body and external power connection locations at the edges or bottom of the substrate body) can be formed on the top and/or bottom surfaces of the core. Vias can be formed through the ceramic sublayers and graphite (or graphene) core, allowing connections between metal traces on the top and bottom surfaces.

In some embodiments, a substrate can have multiple layers, with each layer having a graphite core sandwiched between upper and lower ceramic layers, with metal patterns formed on the top of the upper ceramic layer and or on the bottom of the lower ceramic layer. The layers can be fused together, e.g., by co-firing. The use of multiple layers with metal patterns (e.g., traces) between them allows for greater flexibility in the routing of electrical connections, which can be useful, e.g., where the package includes multiple LEDs or groups of LEDs for which current is independently controllable.

A layer can be formed by applying ceramic tape on both sides of a graphite sheet (or a stack of graphite sheets), depositing a metal pattern onto the top and/or bottom tape surfaces, then co-firing the assembly at an appropriate temperature. Multilayered substrates can be formed by forming metal patterns on ceramic tapes, stacking the ceramic tapes and graphite sheets in an appropriate order, then co-firing the assembly at an appropriate temperature. Alternatively, a layer can be formed by producing a graphite or graphene film using a process such as CVD and bonding the graphite or graphene film to ceramic tape. Two ceramic tapes can be aligned such that the graphite or graphene films are between them, and the assembly can be co-fired.

In some embodiments, rather than having a distinct graphite core sandwiched between ceramic sublayers, a composite material that incorporates graphene and a ceramic can be used to form a substrate layer. For example, graphene and ceramic materials such as AlN are available in powder form. These powders can be mixed in an appropriate ratio depending on desired properties, and a tape can be formed from the mixed powders, e.g., embedding the powders in a matrix material. This tape can be handled in a manner similar to conventional ceramic tapes to produce a single-layer or multi-layer substrate with metal trace patterns.

The following detailed description together with the accompanying drawings will provide a better understanding of the nature and advantages of the present invention.

DETAILED DESCRIPTION

Certain embodiments of the present invention provide substrates and packages for LED-based light devices that can significantly improve thermal performance, allowing the LEDs to operate at higher current and therefore higher brightness. The substrates can incorporate a material with high thermal conductivity in at least the lateral direction (i.e., parallel to a surface on which LEDs are mounted), such as graphite or graphene, to spread heat across the surface of the substrate. In addition to allowing for more efficient heat dissipation, heat spreading reduces the local temperature at "hot spots" within the device, such as the locations of operating LEDs and/or electrically conductive paths. Reducing hot spots can reduce thermal stress and allow a device to operate at higher temperatures without damaging the package.

Figure 1:
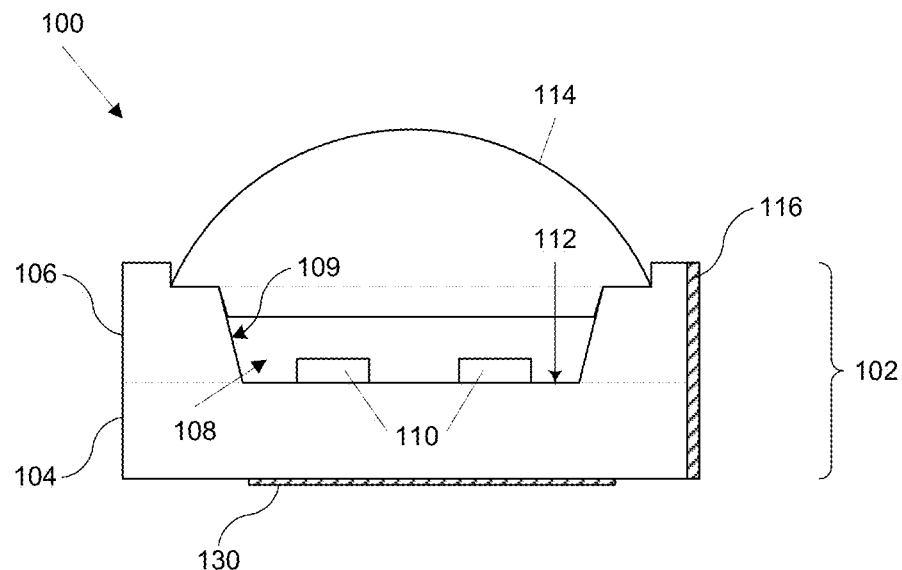
FIG. 1 is a simplified cutaway side view of an assembled LED package according to an embodiment of the invention

FIG. 1 is a simplified cutaway side view of an LED package 100 according to an embodiment of the invention. LED package 100 includes a substrate 102, which can include a base substrate 104 and a superstructure 106. Superstructure 106, which can be made of ceramic materials or from ceramic/graphite materials of the kind described below, can form a recess region 108 as shown. In one embodiment, recess region 108 has the shape of a truncated cone; sidewall 109 is circular and slanted inward, e.g., at an angle of about 20° with respect to the vertical axis. Sidewall 109 of recess 108 can be coated with a reflective material (e.g., silver) to increase light output of the device.

Base substrate 104 can be made of one or more layers that incorporate a material having high lateral thermal conductivity, such as graphite or graphene, as well as a ceramic material for electrical insulation. Examples of layer structures and methods of fabrication that can be used for base substrate 104 are described below.

A number of LEDs 110 are disposed within recess region 108. In some embodiments, LEDs 110 can be physically and electrically connected to the top surface 112 of base substrate 104. For example, top surface 112 can have metal die pads and/or wire-bonding pads formed thereon, and LEDs 110 can be bonded to the die pads and/or wire bonding pads to provide physical and electrical connections.

Any number and type of LEDs 110 may be used. In one embodiment, each LED 110 is a blue LED (any LED that emits light in the blue region of the electromagnetic spectrum) and has a coating of a material containing yellow phosphor applied over its top surface. The yellow phosphor shifts the wavelength of some of the blue light into the yellow region of the electromagnetic spectrum, and the resulting mixture of blue and yellow light yields a white light source. The particular color temperature of a white LED of this kind can vary based on the specific blue wavelength and/or the type and concentration of phosphor material used. In various embodiments, LEDs 110 can include white LEDs, red LEDs, green LEDs, blue LEDs, and/or any other color or combination of colors. While two LEDs 110 are shown in FIG. 1, it is to be understood that any number of LEDs can be included.

Recess region 108 can be filled with silicone or other optically transparent media (e.g., glass, sol-gel), and a primary lens 114 can be placed over the top. In one embodiment, the optically transparent medium in region 108 has an index of refraction that closely matches that of primary lens 114, to reduce light loss at the interface. The optically transparent medium can also have adhesive properties to hold primary lens 114 in position. In some embodiments, the medium can include a wave-shifting material (e.g., phosphor) for altering the color of light emitted by LEDs 110.

Primary lens 114 can be made of glass, silicone or other optically transparent material that is suitably resistant to high temperature. Materials with graded refractive index can also be used. The bottom portion of lens 114 can be tapered to match the sidewall of recess region 8108 and can extend partway down into recess region 114 as shown, leaving a gap between the bottom of lens 114 and the top of LEDs 110. Other primary lenses can also be used.

In some embodiments, package 100 becomes operational when connected to an external power source (not shown). To facilitate connecting package 100 to a power source, electrical contacts 116 can be provided at a peripheral edge of substrate 102 and/or at any other exposed surface of substrate 102. In one embodiment, external contacts 116 include metal coatings that extend vertically along the entire thickness of substrate 102. Any number of external contacts 116 can be provided. External contacts 116 can be connected to the LEDs by providing metal paths on and/or through substrate 102, e.g., as described below.

A metal plate 130 can be disposed on the bottom surface of substrate 102. Metal plate 130, which is advantageously circular and as large as possible in some embodiments, provides a metallic surface for attaching a heat sink, metal-core printed circuit board (MCPCB) or other components. Metal plate 130 can be electrically isolated from the various electrical paths and pads that may be present on, within, and/or under substrate 102. In some embodiments, plate 130 can be made partially or entirely of copper.

Figure 2:
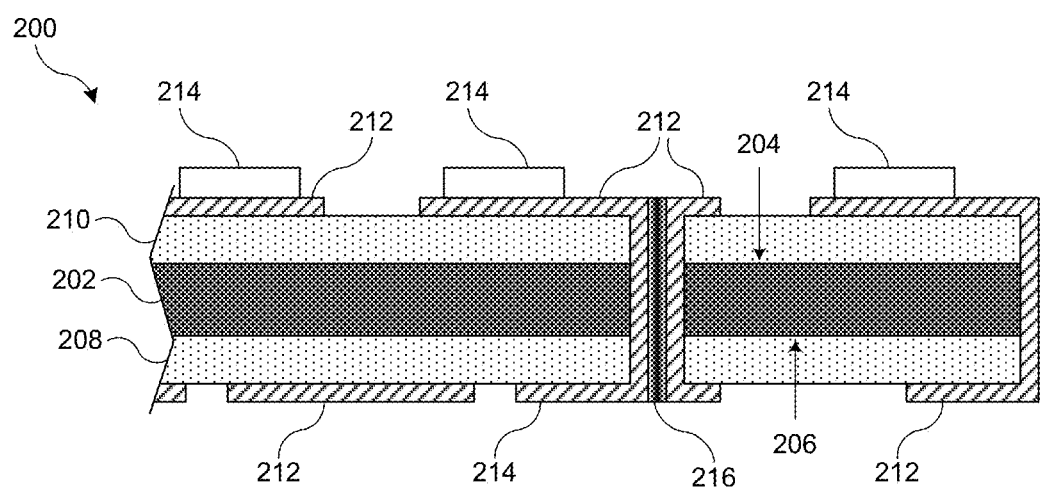
FIG. 2 is a simplified side cross-sectional view of a substrate for an LED package according to an embodiment of the present invention.

FIG. 2 is a simplified side cross-sectional view of a substrate 200 (e.g., implementing a portion of base substrate 104 of FIG. 1) according to an embodiment of the present invention. Substrate 200 has a single body layer that includes a graphite or graphene core 202 having substantially planar (i.e., planar within manufacturing tolerances) top and bottom surfaces 204, 206, as well as a lower ceramic sublayer 208 disposed on bottom surface 206, and an upper ceramic sublayer 210 disposed on top surface 204. Ceramic sublayers 208, 210 can be made, e.g., of alumina ($Al_2O_3$), aluminum nitride (AlN), and/or other ceramic materials.

Metal paths 212 are formed on the top of upper ceramic sublayer 210 and/or on the bottom of lower ceramic sublayer 208. Metal paths 212 can include die pads for mounting LEDs 214 (which can be the same as LEDs 110 of FIG. 1), wire-bonding pads for providing electrical connection to LEDs 214, external contact pads (e.g., contact pads 116 of FIG. 1) for connecting to an external power source, and/or traces connecting the various pads. In some instances, vias such as via 216 can be provided to form electrical connections between metal paths 212 on upper ceramic sublayer 210 and lower ceramic sublayer 208. Metal paths 212 can be connected to provide different, independently controllable power connections to different LEDs 110 (or to different groups of LEDs 110); and a particular layout of metal paths or pattern of connectivity among LEDs is not required.

In some embodiments, metal paths 212 can also include "dummy structures," a term that refers generally to any metal pads, lines or other structures that are not electrically connected to anything else. Dummy structures, where present, can reduce localized differences in mechanical and/or thermal stress between areas where metal is present and areas where metal is not present.

The ceramic material used to form sublayers 208, 210 is advantageously thermally conductive and electrically insulating. For example, alumina has thermal conductivity of roughly 20-30 W/m-K at temperatures of interest for LED operation. The thickness of ceramic sublayers 208, 210 can be chosen as desired and can be, e.g., 0.05-0.10 millimeters (mm). Sublayers 208 and 210 advantageously have the same thickness. To prevent warping of the substrate under thermal stress, sublayers 208 and 210 can be made as flat as possible and can be bonded to graphite core 202 so as to avoid or minimize any air gaps; examples of methods of fabrication are described below.

The thickness of graphite (or graphene) core 202 can also be chosen as desired and can be, e.g., 0.10-0.20 mm. In some embodiments, graphite core 202 can be formed by stacking multiple thin sheets of graphite; for instance, each sheet can have a thickness of about 20-40 or 25-40 micrometers ($\mu m$), and any number of graphite sheets can be stacked to provide a core having a desired thickness.

Figure 3:
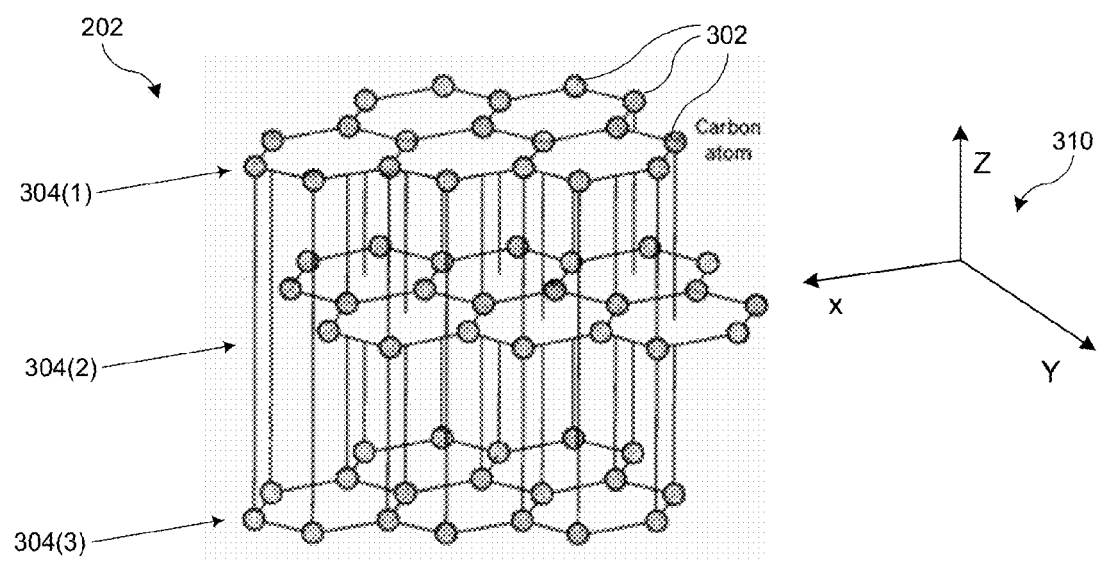
FIG. 3 illustrates the molecular structure of graphite core according to an embodiment of the present invention.

Graphite core 202 can have a strongly anisotropic thermal conductivity and spread heat laterally across substrate 200. FIG. 3 illustrates the molecular structure of graphite core 202 according to an embodiment of the present invention. Graphite core 202 can be made predominantly of carbon atoms 302 bonded into a stack of hexagonal planar graphene structures 304 as shown. It is to be understood that in actual manufacture of graphite sheets or films, impurities or imperfections may be present, and planar structures 304 may or may not be perfectly aligned in the stack.

Thermal conductivity of graphite along the planar structures 304 (parallel to the xy plane in coordinate system 310) can be quite high, e.g., around 1500 W/m-K for "bulk" graphite with thickness in the range of 25-40 $\mu m$. Thin graphite films may exhibit even higher thermal conductivity.

In the direction transverse to planar structures 304 (parallel to the z axis in coordinate system 310), thermal conductivity can be significant lower, e.g., 20-30 W/m-K, which is comparable to that of some ceramic materials.

Referring again to FIG. 2, if graphite core 202 is made of graphene sheets arranged in the lateral direction (i.e., roughly parallel to top surface 204 and bottom surface 206), it can act as a heat spreader, spreading heat from localized sources such as metal paths 212 that are electrically active more evenly across the body of substrate 202. Such heat spreading reduces local "hot spots" and can therefore also reduce thermal stress on substrate 200.

In addition, graphite core 202 can transfer heat from upper ceramic sublayer 210 to lower ceramic sublayer 208, as long as the temperature of lower ceramic sublayer 208 is lower than the temperature of upper ceramic sublayer 210 (where the LEDs, which are typically the primary heat source, are operating). A temperature differential can be maintained during device operation, e.g., using a heat sink, fan, and/or other cooling technology. Heat spreading within graphite core 202 can improve thermal transfer to lower ceramic sublayer 208; further, to the extent that heating of lower ceramic sublayer 208 occurs uniformly across its surface, heat dissipation via a heat sink, fan or similar structure disposed beneath ceramic sublayer 208 can be more effective at keeping LEDs 214 sufficiently cool during high-power operation.

In some embodiments, the thermal properties of graphite core 202 can provide a significant reduction in the operating temperature of LEDs 214 at a given power level. One figure of merit for thermal properties of an LED package substrate is temperature difference between the junction (i.e., the LED) and the case (i.e., the bottom of the substrate), denoted $\Delta T_{JC}$. In one embodiment, a device mounted on a conventional ceramic substrate operates at $\Delta T_{JC}=85°$ C., while the same device mounted on a graphite-core substrate similar to substrate 200 can operate at $\Delta T_{JC}=55°$ C., a 30% reduction. More generally, the particular effect of a graphite core will depend on the particular implementation; for high-power applications, the reduction in $\Delta T_{JC}$ may exceed 50%. Thus, embodiments of the present invention allow LEDs to operate at higher power (and therefore higher brightness) than has previously been feasible in a compact package.

Thermal stress between the graphite core and ceramic sublayers can be low. In temperature ranges where LEDs typically operate, the coefficients of thermal expansion for graphite and alumina are approximately the same. For any materials where this is the case, it is expected that as substrate 200 heats up during device operation, little thermal stress will arise at the graphite/ceramic interface.

Some metals that are desirable as conductors may have thermal expansion coefficients that are not well matched to the coefficients for ceramics and/or graphite. Accordingly, the package may still experience thermal stress under intended operating conditions. In some embodiments, materials, thicknesses, and layouts of metal layers can be selected so as to reduce stress and prevent warping, cracking, or delamination.

Figure 4:
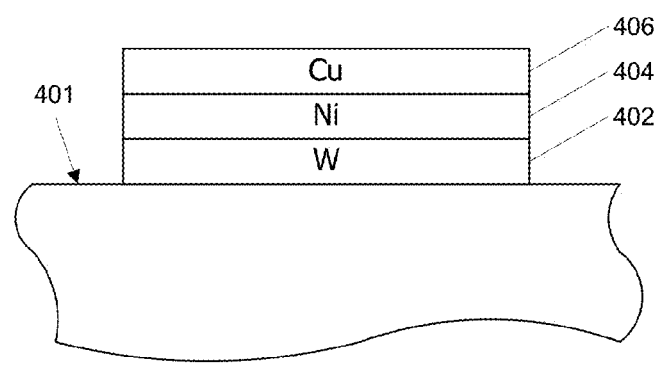
FIG. 4 is a simplified side cross-sectional view showing a metal layer formed on a ceramic surface according to an embodiment of the present invention.

For example, in some embodiments, some or all of metal paths 212 are formed by sequentially depositing "sublayers" of different metals on the ceramic layer. FIG. 4 is a simplified side cross-sectional view showing a metal layer 400 formed on a ceramic surface 401 (e.g., top ceramic sublayer 210 or bottom ceramic sublayer 208 of FIG. 2) according to an embodiment of the present invention. In this embodiment, metal layer 400 consists of a tungsten (W) sublayer 402, a nickel (Ni) sublayer 404, and a copper (Cu) sublayer

406, deposited in that order. These sublayers can each be from a few angstroms up to 100 nm or more in thickness, and different sublayers can have different thicknesses. In one example, the W sublayer is in the approximate range 1.5-4.5 μm (e.g., about 3.0 μm), the Ni sublayer in the approximate range 1.2-8.9 μm (e.g., about 3.0 μm), and the Cu sublayer in the approximate range 0.2-0.35 μm (e.g., about 0.3 μm). Other sublayers can also be provided, e.g., a gold (Au) sublayer in place of Cu sublayer 406. A silver (Ag) sublayer can be used, e.g., for metal paths 212 that are visible on the floor of recess 108 of FIG. 1, to increase the reflectivity of the floor of the recess. External contacts 116 and heat dissipation plate 130 of FIG. 1 may be made of a single layer of metal (e.g., tungsten, copper, or the like) or multiple sublayers as desired.

Figure 5:
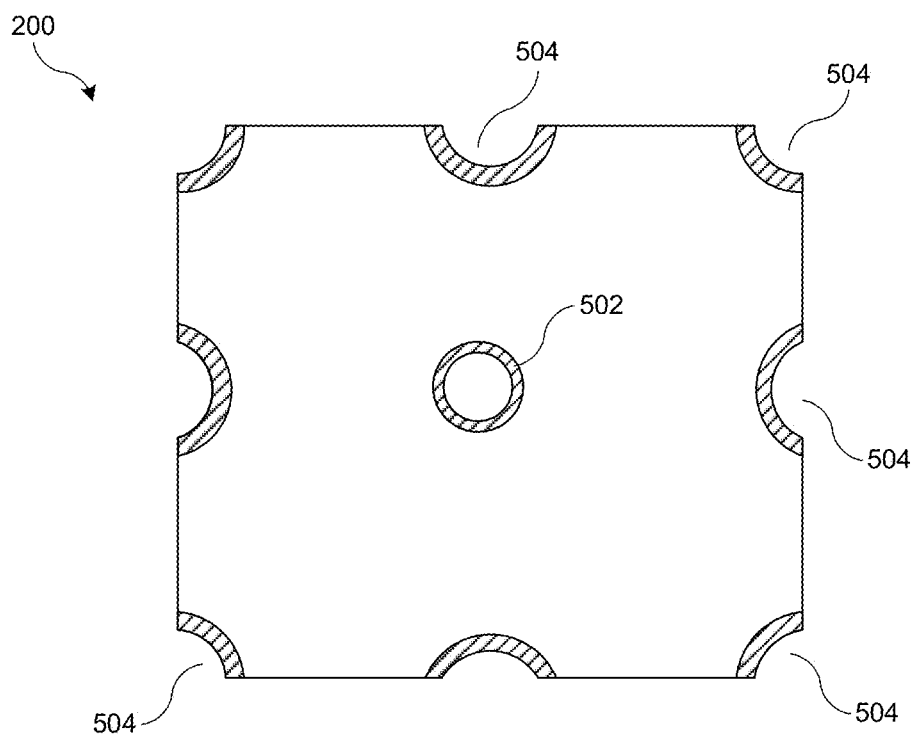
FIG. 5 is a simplified bottom view of a substrate according to an embodiment of the present invention.

Vias 216 of FIG. 2 can also be made of, filled with, or lined with a single metal, e.g., tungsten, or a combination of metals as described above. FIG. 5 is a simplified bottom view of substrate 200 of FIG. 2 illustrating a via 502 and peripheral bond pads 504. Via 502 can be formed by making a hole through ceramic sublayers 208, 210 and graphite core 202, then filling or lining the hole with metal. Peripheral bond pads 504 can be formed similarly, by removing portions of the edges of ceramic layers 208, 210 and graphite core 202. In some embodiments, multiple substrates 200 are fabricated together on a single sheet, and peripheral bond pads 504 can be formed by placing appropriate holes through the sheet, then cutting through the holes.

It is noted that holes can be created through a graphite sheet by using a mechanical punch tool; holes with diameters as small as 10 μm can be made using tools known in the art. Laser cutting tools may be less efficient, due to the high thermal conductivity of graphite. For ceramic materials, mechanical punching and laser cutting are among the available options.

Figure 6:
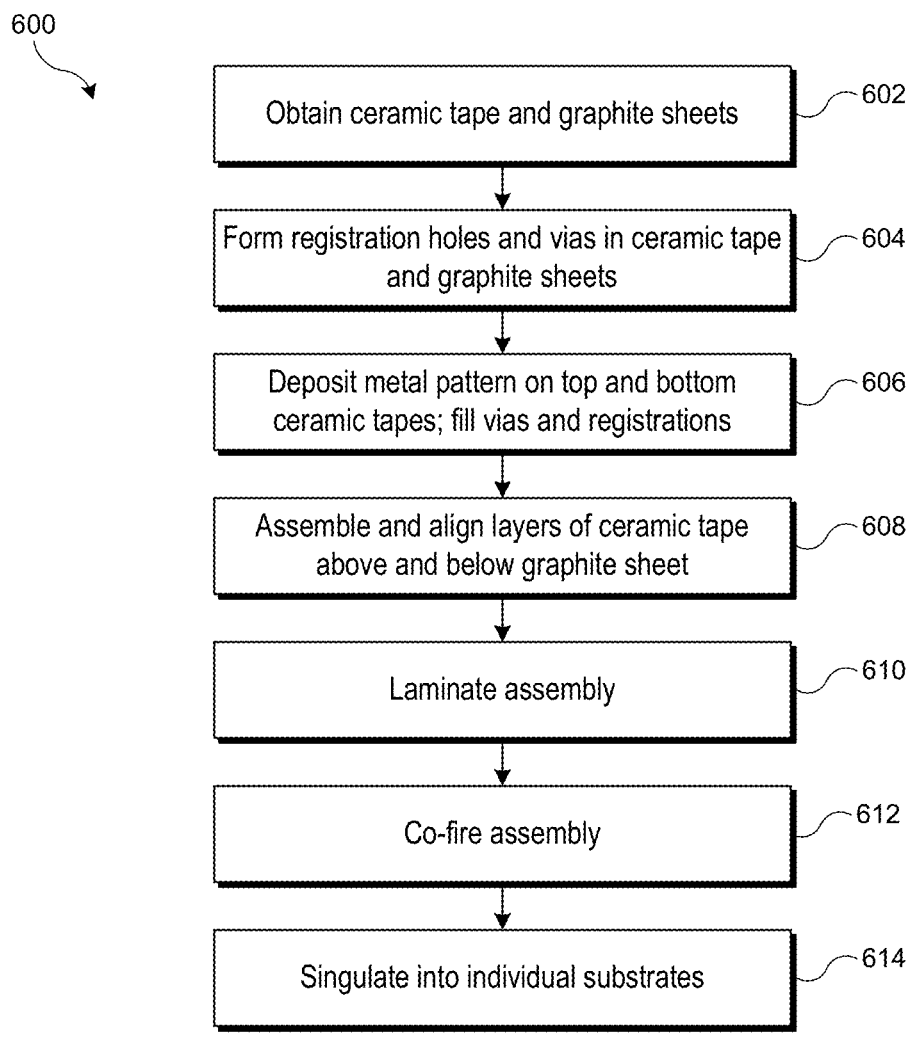
FIG. 6 is a flow diagram of a process for fabricating a substrate with a graphite core according to an embodiment of the present invention

Examples of processes for fabricating substrates such as substrate 200 will now be described. FIG. 6 is a flow diagram of a process 600 for fabricating a substrate with a graphite core (e.g., substrate 200) according to an embodiment of the present invention.

At block 602, ceramic tape and graphite sheets are obtained. These materials can be obtained from commercial sources. For example, alumina tapes having thicknesses in the range from about 0.05 to 0.10 μm are available from multiple sources. In some embodiments, a single layer of ceramic tape of the desired thickness is used to form each ceramic sublayer. In other embodiments, the ceramic tape can be thinner than the desired sublayer thickness, and multiple thicknesses of ceramic tape can be stacked and fused (e.g., by co-firing as described below) to produce a ceramic sublayer having the desired thickness.

Graphite sheets having thicknesses in the range from about 0.20 to 0.40 μm are also commercially available; for example, "Graphinity" sheets manufactured and sold by Kaneka Corporation of Japan can be used. Thermal conductivity in the lateral direction is generally highest when the graphite sheets have constituent planes of carbon atoms with a high degree of alignment. The ceramic tape and graphite sheets can be cut into similarly-sized shapes (e.g., squares or rectangles), either by the supplier or after obtaining them.

At block 604, registrations (e.g., pad indentations) and vias can be formed in the ceramic tape and the graphite sheets. For the ceramic tape, mechanical punching, drilling, laser cutting, photolithography, or other techniques can be used. For the graphite sheets, mechanical punching is a simple and reliable technique, although other techniques can also be used. The pattern of registrations, vias and other openings is determined based on the desired layout. Depending on the size of the ceramic tapes and graphite sheets, multiple copies of the pattern may be formed in different areas of the tapes and sheets.

At block 606, the registrations and vias can be filled, e.g., with a homogenized ink or paste comprised of metal powder, or with a series of different metals (e.g., Cu, W, Ni, Au, Ag), each of which can be applied as an ink or paste. At the same time or subsequently, the metal layers can be deposited on surfaces of the ceramic tapes in the desired pattern. As noted above with reference to FIG. 4, a metal layer can include multiple sublayers. Each metal sublayer can be formed, e.g., by plating the ceramic tape with a metal. Screen printing or other techniques can be used; in one embodiment, a homogenized ink or paste containing the appropriate metal powder (e.g., W, Ni, Au, or Ag) is printed or patterned through a screen on top of the substrate. The thickness of the printing can be controlled for each metal. Other processes such as photoimageable thick-film processing or diffusion patterning may be used to plate the ceramic substrate with a layer or successive sublayers of metal.

At block 608, one or more graphite sheets (depending on thickness of the sheets and the desired thickness of graphite core 202) and the ceramic tapes corresponding to ceramic sublayers 208 and 210 are assembled and aligned (e.g., using the registrations and/or vias as a guide). In some embodiments, thermally conductive adhesives can be placed between the graphite sheets and/or ceramic tapes. At block 610, the assembly can be laminated (pressed together at high temperature). In one embodiment, block 610 can start with a precondition bake where the individual sheets are baked, e.g., at around 50° C. for about 20-30 minutes. In the lamination process, the sheets are stacked together and pressed, for example at a pressure of around 2000 psi and a temperature around 70° C. for about 10 minutes. Other baking and laminating times, temperatures, and pressures may be used, for example depending upon thickness of the stack.

At block 612, the laminated assembly is co-fired. Various co-firing processes can be used. One co-firing process involves at least one baking stage with a peak temperature of around 1100° C., with controlled ramps. Other baking stages, such as an initial stage at a lower peak temperature, can be included. Baking times, temperatures, temperature ramps, and pressures may be optimized for particular materials and thicknesses, and a ramp-down to room temperature might or might not occur between baking stages. If a thermally conductive adhesive was used at block 608, co-firing can evaporate the adhesive component, leaving behind thermally conductive particles that help to bind the layers together.

At step 614, individual substrates are singulated by sectioning the co-fired sheet, e.g., using a dicing saw, ultrasonic cutting tool, or the like.

After the substrate has been fabricated, LEDs can be bonded to the metal pads on the top surface of the substrate. Any type of LED can be used, and a mixture of LED types (e.g., different colors) can be bonded to the same substrate. In some embodiments, the LEDs may have one contact pad on top and another on bottom; in other embodiments, both contact pads can be on top. In either case, conventional surface mounting and/or wire bonding techniques can be used. The recess containing the LEDs can be filled with an optically transparent material (e.g., silicone) and covered with a primary lens.

It will be appreciated that process 600 is illustrative and that variations and modifications are possible. Steps described as sequential may be executed in parallel, order of steps may be varied, and steps may be modified, combined, added or omitted. In some embodiments, forming the substrate can also include forming superstructure 106 of FIG. 1. Superstructure 106 can be formed from one or more additional layers of ceramic tape, with appropriately sized openings made therein, aligned and stacked on top of substrate 200. The entire structure can be assembled, laminated, and co-fired in a single iteration of process 600.

As noted above, in some embodiments, it is desirable to provide for independent addressability (i.e., independently controllable current) to different LEDs or groups of LEDs. In such instances, the electrical paths connecting independently addressable LEDs should be electrically isolated from each other. In order to provide such isolation for a larger number of paths, some embodiments of the present invention provide substrates with multiple layers, where each layer can include a graphite (or graphene) core sandwiched between ceramic sublayers.

Figure 7:
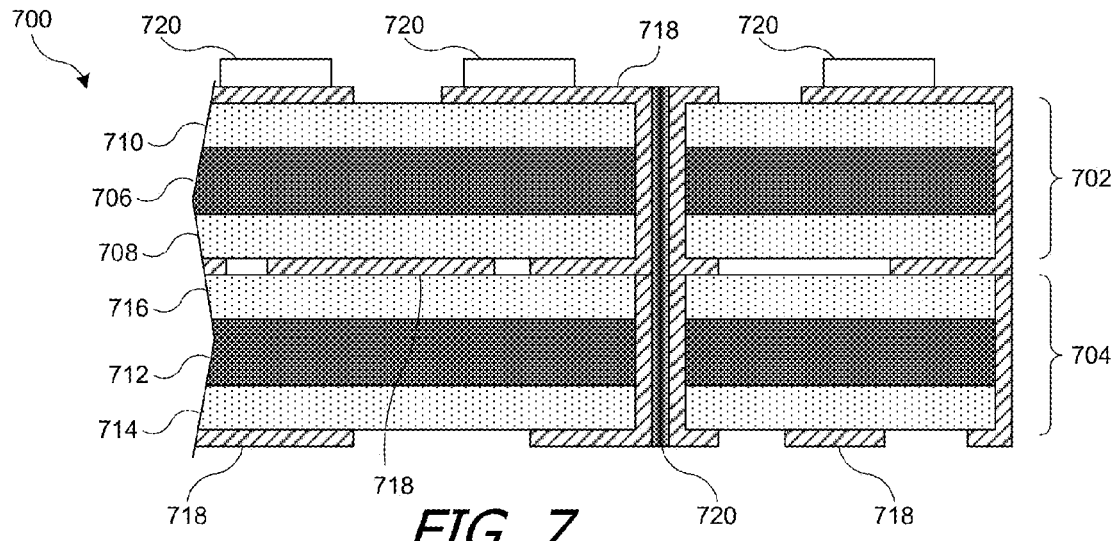
FIG. 7 is a simplified cross-sectional diagram of a two-layer substrate according to an embodiment of the present invention.

By way of illustration, FIG. 7 is a simplified cross-sectional diagram of a two-layer substrate 700 according to an embodiment of the present invention. Substrate 700 includes a first layer 702 and a second layer 704. While only two layers are shown, it is to be understood that substrates having any number of layers can be provided, e.g., by providing multiple instances of second layer 704 with appropriate metal patterning between the layers. Substrate 700 can be used, e.g., as base substrate 104 in package 100 of FIG. 1.

Each of layers 702 and 704 can be generally similar to substrate 200 of FIG. 2. Thus, layer 702 includes a graphite core 706, a lower ceramic sublayer 708, and an upper ceramic sublayer 710; layer 704 includes a graphite core 712, a lower ceramic sublayer 714, and an upper ceramic sublayer 716. Metal paths 718 can be formed on the top surface of ceramic layer 710, the bottom surface of ceramic layer 714, the top surface of ceramic layer 716, and/or the bottom surface of ceramic layer 708. A via 720 is shown passing through layers 702 and 704. LEDs 722 are disposed on the top surface of ceramic sublayer 710 and connected to metal paths 718. In some embodiments, a superstructure (not shown), which can be similar to superstructure 106 of FIG. 1, can be provided on top of first layer 702.

In operation, substrate 700 can function similarly to substrate 200 of FIG. 2. Heat is spread laterally across substrate 700 by graphite cores 706, 712 and transferred transversely through substrate 700 from LEDs 720 to the bottom of layer 704, where it can be dissipated using a heat sink, fan or the like. Graphite cores 706, 712 can help to prevent the formation of hot spots both around LEDs 720 and around portions of metal paths 718 that are disposed on or between layers 702 and 704. This facilitates operation of LEDs 720 at high current (and high power).

Multilayer substrate 700 can be fabricated using processes similar to process 600 described above. In this instance, the number of graphite sheets and ceramic tapes that are aligned and co-fired is generally larger than for a single-layer substrate (e.g., substrate 200). This may affect the co-firing process parameters (e.g., baking times, temperatures, and/or temperature ramp profiles). For interlayer portions of metal paths 718, the metal can be patterned onto either the ceramic tape of sublayer 708 or the ceramic tape of sublayer 716, or portions of the paths can be patterned onto each surface. A superstructure (e.g., superstructure 106 of FIG. 1) can also be formed and co-fired together with substrate 700.

An LED package substrate with a graphite core can facilitate heat spreading and significantly improve thermal performance of the LED device. As noted above, the thermal conductivity of graphite in the direction transverse to its planar structure may be somewhat lower than that of ceramics typically used for LED package substrates. In addition, there is evidence suggesting that thinner graphite structures may have even higher thermal conductivity in the lateral direction than "sheet" structures described above. Accordingly, in some embodiments, it may be desirable to use thin graphite or graphene films rather than graphite sheets. The resulting substrate can be similar to those shown in FIGS. 2 and 7, depending on how many layers are desired; the only difference is in relative thickness of the core and ceramic sublayers.

Figure 8:
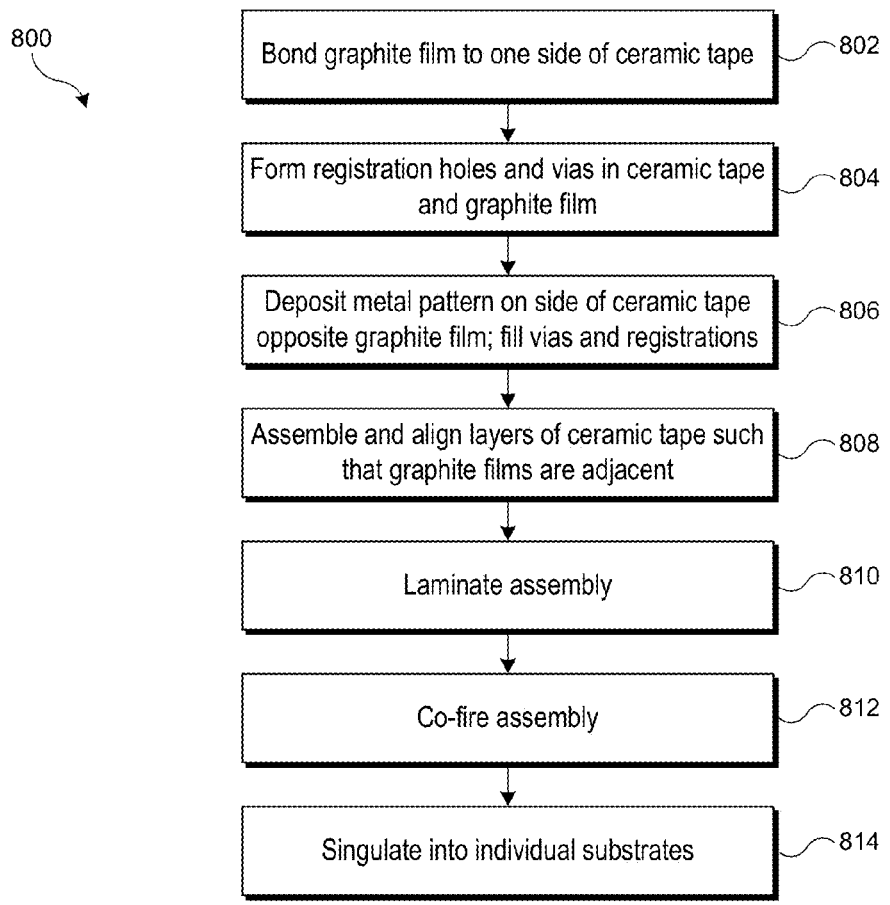
FIG. 8 is a flow diagram of a process for fabricating a substrate with a thin-film graphite core according to an embodiment of the present invention.

FIG. 8 is a flow diagram of a process 800 for fabricating a substrate with a thin-film graphite core according to an embodiment of the present invention. Process 800 is described with reference to a single-layer substrate (e.g., similar to substrate 200), but those skilled in the art will appreciate that the process can be modified to produce a multi-layer substrate (e.g., similar to substrate 700).

At block 802, a thin graphite (or graphene) film, which can be obtained using techniques known in the art such as chemical vapor deposition (CVD), can be bonded to one side of a ceramic tape, which can be similar to ceramic tapes described above. Thermally conductive adhesives can be used for the bonding.

At block 804, registrations and vias are formed in the bonded ceramic-graphite structure. This can be generally similar to block 604 of process 600 described above; for instance, a mechanical punch tool can be used. The remaining blocks 806-814 can also be generally similar to corresponding blocks 606-614 of process 600 described above. Co-firing process parameters may be different due to the different relative thicknesses of ceramic and graphite in the thin-film structure.

In some embodiments, graphite films are bonded to two sheets of ceramic tape, and the tapes are assembled with the graphite films oriented toward each other. In other embodiments, a sheet of ceramic tape that has been bonded to a graphite film can be assembled together with a second sheet of ceramic tape that has not been bonded to a graphite film. In still other embodiments, one or more additional graphite films can be bonded to the first graphite film on a given surface, allowing graphite structures of any desired thickness to be built up from successive films.

In the case of a multilayer substrate (e.g., substrate 700 of FIG. 7), the assembly can have patterned metal at the top, then ceramic, graphite (one or more films), ceramic, patterned metal, ceramic, graphite film(s), and so on. As long as the active metal paths are separated from the graphite films by electrically insulating ceramic material, the device will continue to have good electrical performance.

Figure 9:
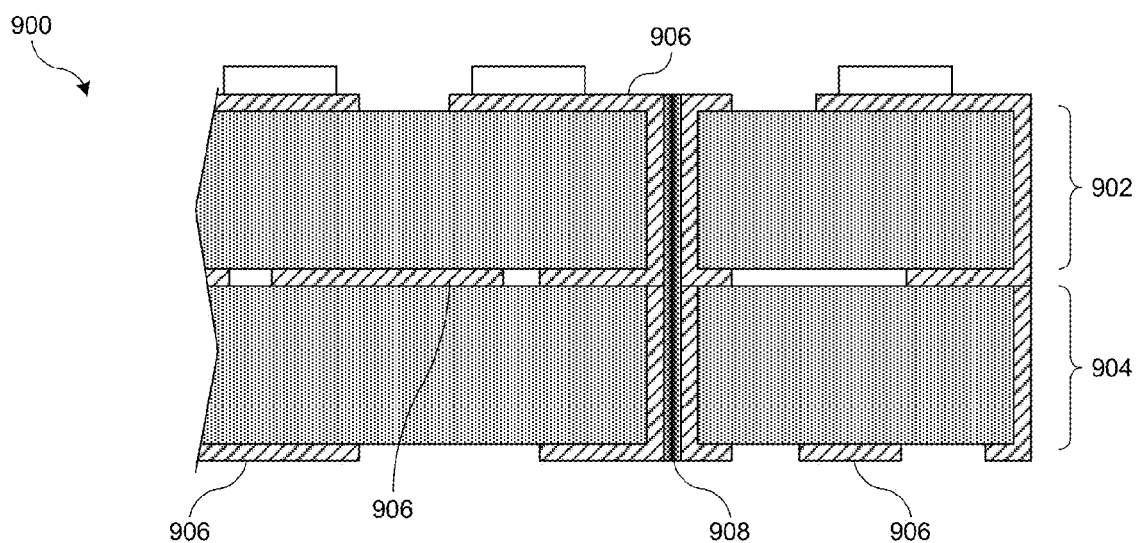
FIG. 9 is a simplified cross-sectional side view of a multilayer substrate according to an embodiment of the present invention that incorporates a composite material.

Some alternative embodiments provide substrates with one or more layers that do not have a distinct graphite core. Instead, a substrate (or a layer thereof) may be formed from a composite material that includes both graphene (or graphite) and ceramic particles. FIG. 9 is a simplified cross-sectional side view of a multilayer substrate 900 according to an embodiment of the present invention that incorporates a composite material.

Substrate 900 in this example includes layers 902 and 904. While two layers are shown, it is to be understood that a substrate can include any number of layers. Layers 902 and 904 are made of a composite material that incorporates a mixture of graphene (or graphite) particles and ceramic particles. The top and/or bottom surfaces of layers 902 and 904 can have metal paths 906 formed thereon. Via 908 extends through substrate 900 to provide a preferred electrical path between the top surface of layer 902 and the bottom surface of layer 904. Except for the material composition of layers 902, 904, substrate 900 can be similar to other substrates described herein.

Figure 10:
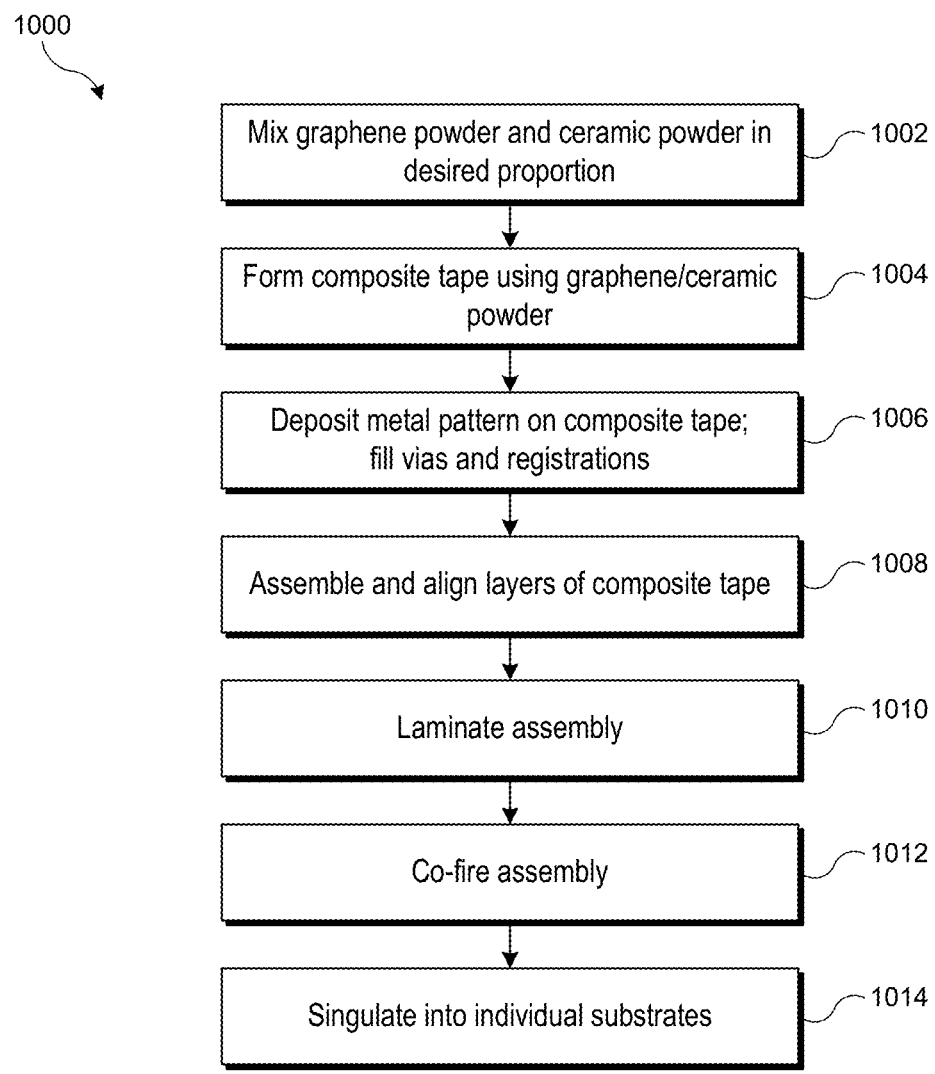
FIG. 10 is a flow diagram of a process for fabricating a composite-material substrate according to an embodiment of the present invention.

FIG. 10 is a flow diagram of a process 1000 for fabricating a composite-material substrate, such as substrate 900, according to an embodiment of the present invention. At block 1002, graphene powder and ceramic powder (e.g., alumina) are mixed in a desired proportion. Commercially available powders can be used. The proportion can be chosen according to design goals for a particular device. For example, an increased concentration of graphene powder relative to ceramic powder will tend to increase thermal conductivity in the resulting substrate. However, because graphene is a zero-bandgap semiconductor, an increased concentration of graphene will also tend to increase electrical conductivity within the substrate. A desired set of properties can be achieved by adjusting the proportions accordingly. In addition, the composite material may also have a lower coefficient of thermal expansion than a pure ceramic (e.g., around 1-4 ppm/° C. for the composite versus around 4.7-11.7 ppm/° C. for conventional ceramic).

At block 1004, a composite tape can be formed using the mixed graphene/ceramic powder. Conventional techniques for forming ceramic tapes can be used. For example, the mixed graphene/ceramic powder can be dispersed in a solvent to create a slurry. The slurry can also include other additives, such as binding agents to interconnect the particles of powder, plasticizer to dissolve organic compounds, dispersants, wetting agents, defoamers, homogenizers, preservatives, flow control agents, and deflocculants. To form the tape, the slurry can be cast onto a moving carrier surface that has been coated with a smooth "non-stick" carrier film such as plastic or poly(tetrafluoroethylene). A blade can spread the slurry onto the carrier film at a specified thickness, resulting in a smooth tape. The thickness of the sheets can be controlled to produce substrates or layers of different thicknesses as desired, and in some instances a layer can be formed from a stack of two or more tape sheets. Heating elements (e.g., heat lamps) evaporate the solvent. When dry, the tape is removed from the carrier film. After the tape is made, it can be sectioned into discrete units that will be formed into substrates; registration holes and vias can be made in the substrate, e.g., using mechanical punching, drilling, laser cutting, photolithography, or other techniques.

At block 1006, a metal pattern can be deposited onto the tape, and the registration holes and vias can also be filled, similarly to block 606 of process 600 described above. The patterned tape layers can be assembled and aligned (block 1008), laminated (block 1010), co-fired (block 1012), and singulated (block 1014). These portions of process 1000 can be similar to corresponding blocks 608-614 of process 600 and 808-814 of process 800 described above. Similarly to processes 600 and 800, optimal processes for laminating and co-firing the layers will depend on the particular properties of the composite material.

It will be appreciated that the devices and processes described herein are illustrative and that variations and modifications are possible. Graphite-core substrates and other graphite-containing (or graphene-containing) substrates can be manufactured using a variety of processes, including but not limited to the processes described above.

A substrate can include any number of layers, and the thicknesses of different layers and/or thicknesses of various sublayers within a given layer can be modified as desired. In some embodiments, a multilayer substrate can include layers having different thicknesses and/or different composition. For example, in a multilayer substrate, the topmost layer (on which the LEDs are to be placed) can be a graphite-core layer similar to substrate 200 to provide rapid heat spreading away from the LEDs, while some or all of the other layers are formed from a composite graphite/ceramic material similar to layers 902, 904 of substrate 900, or some layers can be made of ceramic material without the introduction of graphite or graphene. Many other configurations can also be used.

Materials referred to herein are also illustrative. Different ceramic materials and/or metals can be substituted for specific materials identified herein.

References to graphite and/or graphene are also illustrative. Where specific reference is made to graphite, it is to be understood that bulk graphite (e.g., graphite films or sheets) can be used, or one or more sheets of graphene can be assembled and oriented appropriately to provide heat spreading. Further, in some embodiments other materials with appropriate thermal properties can be substituted for graphite or graphene. For example, diamond (another form of carbon) has high thermal conductivity and can be substituted for graphite or graphene. A material containing suitably aligned carbon nanotubes or other nanostructures that provide high thermal conductivity can also be substituted. The material also need not be carbon-based; for example, boron nitride is known to form structures analogous to graphene, carbon nanotubes, diamond, and the like, and such structures can also provide high thermal conductivity.

The metal paths can also be varied as desired. For example, a substrate can be optimized for a particular number and type of LEDs and can provide appropriately positioned die attachment pads and/or wire-bond pads to facilitate electrical connection to each LED die. The substrate can also be optimized for a particular pattern of interconnection among LEDs, including connection of all LEDs in a single series, separate connection to each LED (allowing each LED to be independently addressable), or separate connection to two or more serially-connected groups of LEDs where each group is independently addressable. The geometry of the metal paths can also be adapted to the electrical requirements of a particular device; for example, wider paths and/or wider spacing between paths may be provided for devices designed to operate at higher current.

LED packages incorporating substrates described herein (e.g., package 100 of FIG. 1) can be mounted on a metal-core PCB or directly on a heat sink. To provide power to the LEDs, leads for external power connections can be attached to metal pads on the top, bottom, and/or sides of the package substrate. In various embodiments, LED packages incorporating substrates described herein can be used as components in lamps and other lighting devices, e.g., in residential, commercial, personal and/or other applications.

While the invention has been described with respect to specific embodiments, one skilled in the art will recognize that numerous modifications are possible. For instance, the number of LEDs and electrical connectivity thereof provided for on a substrate can be varied as desired. Thus, in various embodiments, each LED might be independently addressable, or groups of LEDs can be connected together and addressed as a unit. Thermal transfer is advantageously provided by the substrate itself, independently of the electrical connectivity.

Any type(s) of LED (broadly understood as any semiconductor device that emits light when a current is applied) can be used, including but not limited to conventional red, green, blue, amber, infrared, and ultraviolet LEDs. Further, different types of LEDs can coexist on the same substrate. Wavelength-shifting material (e.g., phosphor-containing material) may be applied to the surface of the LED, incorporated into the recess, or omitted entirely as desired. In addition, light sensors may be incorporated in place of some of the LEDs, and such light sensors might be used to provide feedback for adjusting the light output using automatic or manual control systems. Thus, any type of solid-state light device (including light emitters, light sensors, and/or any combination thereof) can be used in connection with practicing the present invention.

Further, the materials, processes, and tools described herein are also merely examples and can be varied. For example, the particular metal sublayers herein can be replaced or augmented with other electrically conductive materials, and more or fewer sublayers could be used. Different processing techniques can be employed. In addition, all dimensions stated herein are for purposes of illustration and can be varied as desired.

The overall form factor of substrates or packages may be varied from the examples shown herein. Packages can be larger or smaller and need not be square in area; rectangular, circular, or other shapes can be substituted. Substrate thickness can also be varied; the recess can be varied in size and shape (or omitted entirely), and other form-factor modifications made.

In some embodiments, a package can include a primary lens or other refractive media and/or optically transparent media overlying and protecting the LEDs on the substrate. A packages can be incorporated into a lamp having any desired form factor; for example, using the compact substrates described herein, a lamp can be sized and shaped as a replacement for existing incandescent, halogen, or compact fluorescent light bulbs. Entirely new form factors are also contemplated. A lamp can incorporate a heat sink and/or any other thermal management structures that may be desirable to keep the bottom surface of the substrate sufficiently cool, i.e., at a temperature that provides safe operation of the LED given the intended device power and thermal transfer capabilities of a particular substrate.

Thus, although the invention has been described with respect to specific embodiments, it will be appreciated that the invention is intended to cover all modifications and equivalents within the scope of the following claims.

What is claimed is:

1. A substrate for a lighting apparatus, the substrate comprising:
    a body layer having:
        a graphite core consisting of one or more graphite sheets, the graphite core having substantially planar top and bottom surfaces;
        an upper ceramic sublayer disposed on the top surface of the graphite core; and
        a lower ceramic sublayer disposed on the bottom surface of the graphite core;
    a first patterned metal layer disposed on a top surface of the upper ceramic sublayer, wherein the first patterned metal layer includes a plurality of electrical contact pads for bonding to a plurality of light-emitting diode (LED) dies; and
    a second patterned metal layer disposed on a bottom surface of the lower ceramic sublayer, portions of the second patterned metal layer being electrically connected to portions of the first patterned metal layer.

2. The substrate of claim 1 wherein the upper and lower ceramic sublayers are made primarily of alumina ($Al_2O_3$).

3. The substrate of claim 1 wherein the upper and lower ceramic sublayers are made primarily of aluminum nitride (AlN).

4. The substrate of claim 1 wherein the one or more graphite sheets have a thickness between about 20 μm and about 45 μm.

5. The substrate of claim 1 wherein the one or more graphite sheets are formed from one or more graphite films.

6. The substrate of claim 1 wherein the upper ceramic sublayer and the lower ceramic sublayer each have a thickness between about 0.05 mm and about 0.10 mm.

7. The substrate of claim 1 wherein the upper ceramic sublayer and the lower ceramic sublayer each have the same thickness.

8. The substrate of claim 1 wherein the graphite core has a thickness between about 0.10 mm and about 0.20 mm.

9. The substrate of claim 1 wherein the first patterned metal layer includes a plurality of die pads connectable to bottom surfaces of the LED dies.

10. The substrate of claim 1 wherein the first patterned metal layer and the second patterned metal layer are patterned to provide an in-series electrical connection for two or more of the LED dies.

11. The substrate of claim 1 wherein the first patterned metal layer and the second patterned metal layer each are formed from a plurality of metal sublayers of different metals.

12. The substrate of claim 11 wherein the plurality of metal sublayers includes a tungsten sublayer, a nickel sublayer, and a copper sublayer.

13. A substrate for a lighting apparatus, the substrate comprising:
    a plurality of layers including at least a top layer and a bottom layer, wherein each layer has a body having:
        a graphite core consisting of one or more graphite sheets, the graphite core having substantially planar top and bottom surfaces;
        an upper ceramic sublayer disposed on the top surface of the graphite core; and
        a lower ceramic sublayer disposed on the bottom surface of the graphite core;
    a first patterned metal layer disposed on a top surface of the upper ceramic sublayer of the top layer, wherein the first patterned metal layer includes a plurality of electrical contact pads for bonding to a plurality of light-emitting diode (LED) dies;
    a second patterned metal layer disposed on a bottom surface of the lower ceramic sublayer of the bottom layer, portions of the second patterned metal layer being electrically connected to portions of the first patterned metal layer; and
    an intermediate patterned metal layer disposed between the lower ceramic sublayer of the top layer and an upper ceramic sublayer of a next one of the plurality of layers.

14. The substrate of claim 13 wherein the upper and lower ceramic sublayers of each layer are made primarily of alumina ($Al_2O_3$).

15. The substrate of claim 13 wherein the upper and lower ceramic sublayers of each layer are made primarily of aluminum nitride (AlN).

16. The substrate of claim 13 wherein the one or more sheets of graphite sheets have a thickness between about 20 μm and about 45 μm.

17. The substrate of claim 13 wherein the one or more graphite sheets are formed from one or more graphite films.

18. The substrate of claim 13 wherein the upper ceramic sublayer and the lower ceramic sublayer of at least one of the plurality of layers each have a thickness between about 0.05 mm and about 0.10 mm.

19. The substrate of claim 13 wherein the upper ceramic sublayer and the lower ceramic sublayer of at least one of the plurality of layers have the same thickness.

20. The substrate of claim 13 wherein the graphite core of at least one of the plurality of layers has a thickness between about 0.10 mm and about 0.20 mm.

21. The substrate of claim 13 wherein the first patterned metal layer includes a plurality of die pads connectable to bottom surfaces of the LED dies.

22. The substrate of claim 13 wherein the first patterned metal layer and the second patterned metal layer are patterned to provide an in-series electrical connection for two or more of the LED dies.

23. The substrate of claim 13 wherein the first patterned metal layer and the second patterned metal layer each are formed from a plurality of metal sublayers of different metals.

24. The substrate of claim 23 wherein the plurality of metal sublayers includes a tungsten sublayer, a nickel sublayer, and a copper sublayer.

\* \* \* \* \*